United States Patent
Jones et al.

(10) Patent No.: US 11,062,933 B2
(45) Date of Patent: Jul. 13, 2021

(54) DIE PLACEMENT AND COUPLING APPARATUS

(71) Applicant: Intel Corporation, Santa Clara, CA (US)

(72) Inventors: Jesse C. Jones, Chandler, AZ (US); Gang Duan, Chandler, AZ (US); Yosuke Kanaoka, Phoenix, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 16/037,459

(22) Filed: Jul. 17, 2018

(65) Prior Publication Data
US 2020/0027775 A1  Jan. 23, 2020

(51) Int. Cl.
*H01L 23/00* (2006.01)
*H01L 21/683* (2006.01)
*B25B 11/00* (2006.01)

(52) U.S. Cl.
CPC ........ *H01L 21/6838* (2013.01); *B25B 11/005* (2013.01); *H01L 2924/00* (2013.01); *H01L 2924/00014* (2013.01)

(58) Field of Classification Search
CPC .............. H01L 24/75; H01L 24/00; H01L 2924/00014; H01L 2224/73204; H01L 24/83; H01L 2224/75745
See application file for complete search history.

(56) References Cited

U.S. PATENT DOCUMENTS

| | | | | |
|---|---|---|---|---|
| 5,680,698 A | * | 10/1997 | Armington | G02B 6/4221 29/833 |
| 2003/0054588 A1 | * | 3/2003 | Patel | B81C 1/00904 438/107 |
| 2006/0154403 A1 | * | 7/2006 | McLellan | H01L 21/4832 438/113 |
| 2008/0135787 A1 | * | 6/2008 | Deng | G02B 6/43 250/552 |
| 2008/0233680 A1 | * | 9/2008 | Okamoto | H01L 21/6838 438/118 |
| 2010/0320595 A1 | * | 12/2010 | Horning | B81B 7/007 257/698 |

(Continued)

*Primary Examiner* — Lee D Wilson
*Assistant Examiner* — Mahdi H Nejad
(74) *Attorney, Agent, or Firm* — Schwegman Lundberg & Woessner, P.A.

(57) ABSTRACT

A die placement and coupling apparatus may include a die bonding attachment. The die placement and coupling apparatus may include a compliant head unit that may be adapted to optionally couple with a semiconductor die. The compliant head unit may include a die attach surface that may include a layer of compliant material. The layer of compliant material may be coupled to the compliant head unit. The die attach surface may be adapted to mate with the semiconductor die when the semiconductor die is coupled with the compliant head unit. The layer of compliant material may be adapted to yield in response to an applied force. The die placement and coupling apparatus may include a vacuum port in communication with the die attach surface. The port may be adapted to have a vacuum applied to the port, and the vacuum temporarily holds the semiconductor die to the die attach surface.

21 Claims, 5 Drawing Sheets

(56) References Cited

U.S. PATENT DOCUMENTS

2016/0317090 A1* 11/2016 Han .................. A61B 5/14532
2017/0186721 A1*  6/2017 Kira ....................... H01L 25/04
2018/0096946 A1*  4/2018 Meyers ................ H01L 21/563
2018/0339413 A1* 11/2018 Halbritter ........... B32B 37/1018

* cited by examiner

DIE PLACEMENT AND COUPLING APPARATUS

BACKGROUND

Semiconductor die are included in electronic devices. The placement of the semiconductor die on a substrate may be challenging. For instance, a surface of the substrate may be uneven and the uneven surface of the substrate may make coupling the semiconductor die to the substrate difficult. Additionally, one or more voids may be present between the semiconductor die and the substrate.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that a problem to be solved may include reducing the occurrence of voids when coupling a semiconductor die with a substrate. The present inventors have recognized, among other things, that a problem to be solved may include reducing the occurrence of the semiconductor die separating from the substrate after the semiconductor die is coupled with the substrate. The present subject matter may help provide a solution to this problem, such as by providing a die placement and coupling apparatus.

The die placement and coupling apparatus may include a die bonding attachment. The die placement and coupling apparatus may include a compliant head unit that may be adapted to optionally couple with a semiconductor die. The compliant head unit may include a die attach surface that may include a layer of compliant material. The layer of compliant material may be coupled to the compliant head unit. The die attach surface may be adapted to mate with the semiconductor die when the semiconductor die is coupled with the compliant head unit. The layer of compliant material may be adapted to yield in response to an applied force. The die placement and coupling apparatus may include a vacuum port in communication with the die attach surface. The port may be adapted to have a vacuum applied to the port, and the vacuum temporarily holds the semiconductor die to the die attach surface.

Figure 1:
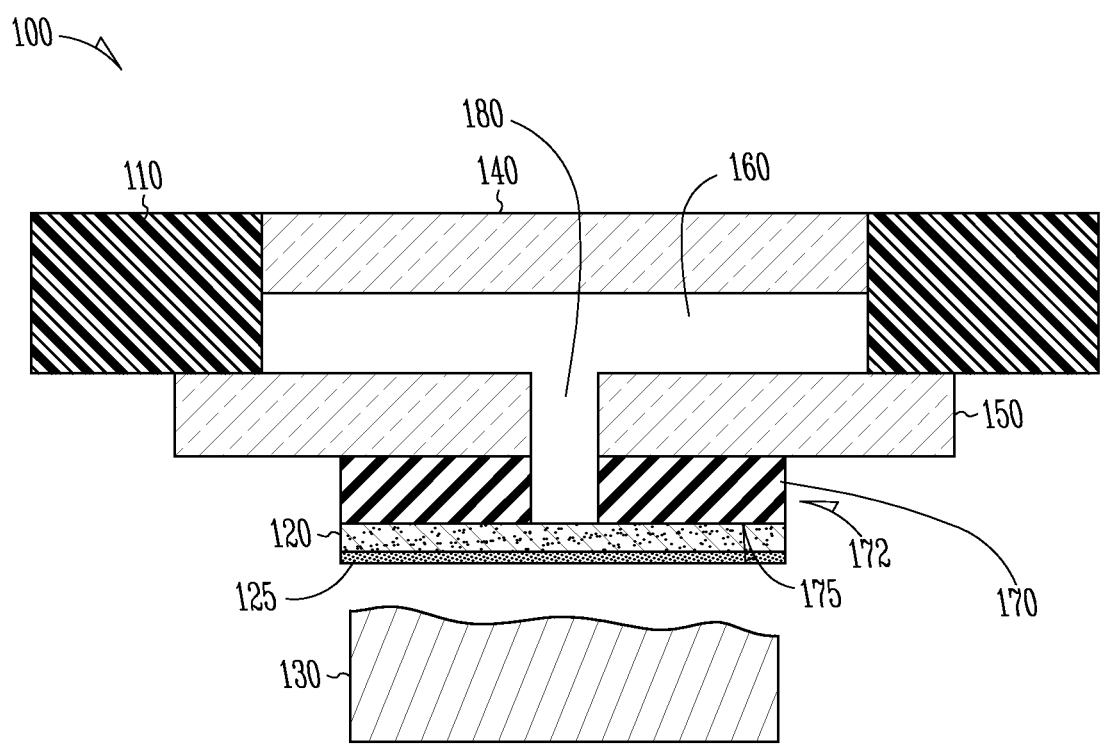
FIG. 1 illustrates a schematic, cross-sectional view of one example of a die placement and coupling apparatus, in accordance with an example of the present subject matter.

FIG. 1 illustrates a schematic, cross-sectional view of one example of a die placement and coupling apparatus 100, in accordance with an example of the present subject matter.

The die placement and coupling apparatus 100 may include a die bonding attachment 110. The die bonding attachment 110 may be included in a pick and place apparatus. The pick and place apparatus is used, for example, in manufacturing operations for electronic devices (e.g., cellular telephones, tablet computers, portable electronic devices, desktop computers, or the like). The pick and place apparatus may include a robotic arm, and the robotic arm may include one or more degrees of freedom.

In an example, the die placement and coupling apparatus 100 is adapted to translate (e.g., move, change position, or the like) a semiconductor die 120, including (but not limited to) translating the semiconductor die 120 from a first position to a second position. The die placement and coupling apparatus 100 may position the semiconductor die 120 on a surface of a substrate 130. In an example, the substrate 130 includes one or more layers that include a dielectric material and electrical traces (e.g., copper routing traces). In another example, the substrate 130 includes a glass carrier. The die placement and coupling apparatus 100 may couple the semiconductor die 120 to the substrate 130, for example by applying a force to the semiconductor die 120 and pressing the semiconductor die 120 against the substrate 130. A die bonding film 125 may help couple the semiconductor die 120 with substrate 130. The die bonding film 125 may include an adhesive, and the adhesive may couple the semiconductor die 120 with the substrate 130.

As shown in FIG. 1, a surface (e.g., a top surface, or exposed surface) of the substrate 130 may be non-uniform (e.g., non-planar, undulating, uneven, rough, or the like). For example, the surface of the substrate 130 may be non-uniform as a result of variations in the manufacturing process for the substrate 130. Coupling the semiconductor die 120 to a non-uniform surface of the substrate 130 may be difficult, because a void may be present between the semiconductor die 120 (and the die bonding film 125) and the substrate 130. The presence of the void between the substrate 130 and the semiconductor die 120 may reduce the mechanical bond between the semiconductor die 120 and the substrate 130. For instance, the void may reduce the surface area of the die bonding film 125 coupled to the substrate 130, and the reduced surface area may limit the mechanical strength of the bond between the semiconductor die 120 and the substrate 130.

As described herein, the die bonding attachment 110 may be utilized in manufacturing operations for electronic devices. For instance, the die bonding attachment 110 may include one or more windows, including (but not limited to) a first window 140. The one or more windows may include a transparent (or substantially transparent) material (e.g., glass, acrylic, air, or the like) and may help in the observation of objects coupled with the die placement and coupling apparatus 100 (e.g., the semiconductor die 120). The one or more windows may be defined by the die bonding attachment 110, and accordingly the one or more windows may facilitate the observation of objects coupled with the die placement and coupling apparatus 100.

In an example, the first window 140 is positioned on a first side (e.g., top side) of the die bonding attachment 110, and the semiconductor die 120 is positioned on a second side (e.g., bottom side) of the die bonding attachment 110. The die bonding attachment 110 may have larger physical dimensions than the semiconductor die 120, and the die bonding attachment 110 may obscure the semiconductor die 120 from observation. The one or more windows help allow for the observation of the semiconductor die 120 from the first side of die bonding attachment 110.

Additionally, the die bonding attachment 110 may include a second window 150, and the second window 150 may be included in the one or more windows. The die bonding attachment 110 may include a vacuum passageway 160. The first window 140 and the second window 150 may define the vacuum passageway 160. The die placement and coupling apparatus 100 (or the system 400 described with reference to FIG. 4) may include a vacuum source, and the vacuum passageway 160 may be in fluidic communication with the vacuum source. The vacuum source may generate a pressure differential within the vacuum passageway 160, in comparison to atmospheric conditions surrounding the die placement and coupling apparatus 100.

The die placement and coupling apparatus 100 includes a compliant head unit 170. The compliant head unit 170 may include a die attach surface 175. The die attach surface 175 may be adapted to mate with the semiconductor die 120. The compliant head unit 170 is adapted to optionally couple with electronic components, including (but not limited to), the semiconductor die 120. Additionally, the compliant head unit 170 is, in some examples, adapted to selectively couple with the die bonding attachment 110.

The compliant head unit 170 includes a compliant material 172 that may yield (e.g., displace, deform, conform, or the like) in response to an applied force (e.g., a force applied by the die bonding attachment 110 or the pick and place apparatus). The compliant material 172 may include (but is not limited to) ePTFE, PTFE, silicone rubber, or polyurethane rubber.

In an example, the compliant material 172 may yield in response to an applied force and the yielding of the compliant material 172 allows the die attach surface 175 to conform to a non-uniform surface of the substrate 130. The conformance of die attach surface 175 to the non-uniform surface of the substrate 130 may help distribute the force applied to the semiconductor die 120 (or the substrate 130), and may help improve the coupling between the semiconductor die 120 and the substrate 130. For instance, the compliant head unit 170 may help reduce the occurrence of a void between the semiconductor die 120 and the substrate 130 when the semiconductor die 120 is coupled to the substrate 130.

As described herein, the die placement and coupling apparatus 100 may include the vacuum passageway 160. The compliant head unit 170 may include a vacuum port 180, and the vacuum port 180 may be in fluidic communication with the vacuum passageway 160. The vacuum port 180 may define a void in the compliant head unit 170. The vacuum port 180 may be in fluidic communication with the die attach surface 175, and a vacuum applied to the vacuum port 180 allows for electronic components (e.g., the semiconductor die 120) to be temporarily held at the die attach surface 175. In some examples, the vacuum port 180 is included in a plurality of vacuum ports, and the plurality of vacuum ports may be in fluidic communication with the vacuum passageway 160.

In an example, the die placement and coupling apparatus 100 is positioned proximate the semiconductor die 120. The semiconductor die 120 may be in a first position. For example, the semiconductor die 120 may be positioned in a JEDEC tray, die-on-mylar frame, tape and reel, waffle pack, or the like. The die attach surface 175 may be mated with the semiconductor die 120, and a vacuum is applied to the vacuum port 180 (e.g., by a vacuum source in communication with the vacuum passageway 160). The vacuum may couple, or temporarily hold, the semiconductor die 120 with the die attach surface 175. The die placement and coupling apparatus 100 may be repositioned, and the repositioning will translate the semiconductor die 120. The semiconductor die 120 may be positioned at a second position, for example on a (non-uniform) surface of the substrate 130. In another example, the second position includes positioning the semiconductor die 120 within a cavity defined by the substrate 130, and the cavity may extend partially through a thickness of the substrate 130.

Figure 2:
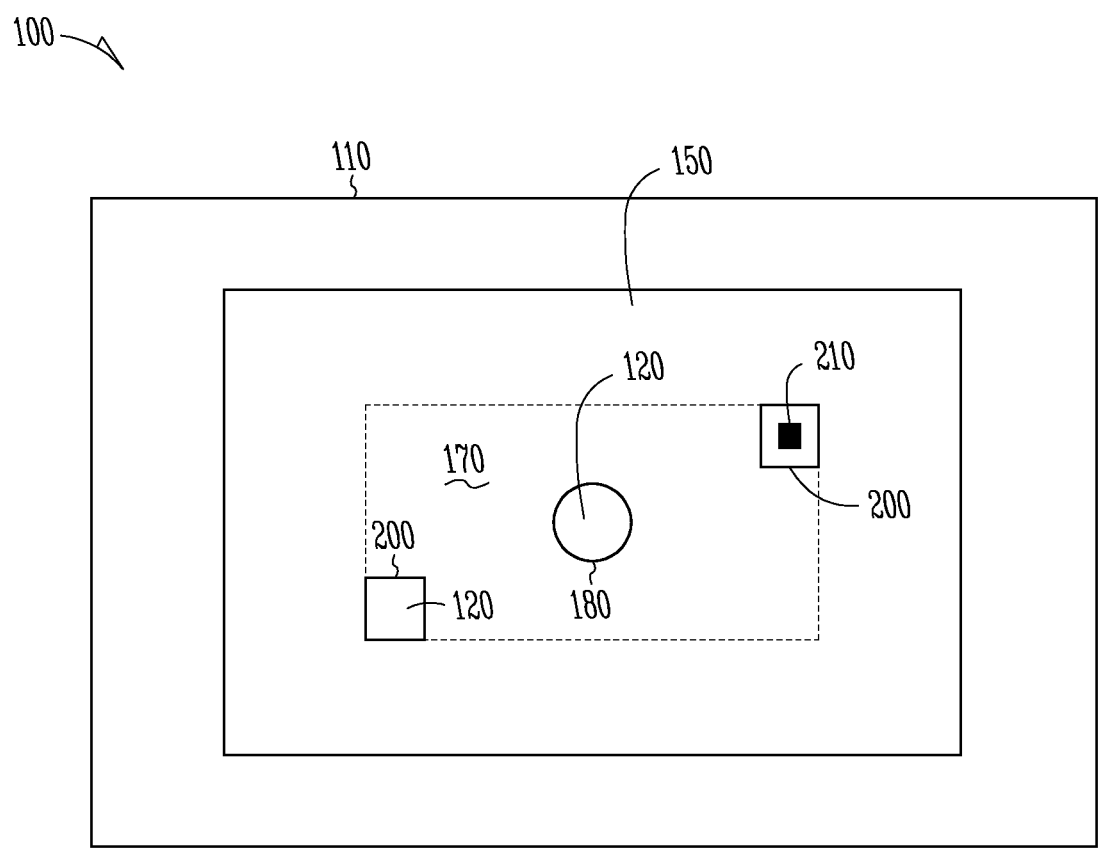
FIG. 2 illustrates a schematic, planar view of one example of the die placement and coupling apparatus, in accordance with an example of the present subject matter.

FIG. 2 illustrates a schematic, planar (e.g., top) view of one example of the die placement and coupling apparatus 100, in accordance with an example of the present subject matter. As described herein, the compliant head unit 170 may be positioned on the second side of the die bonding attachment 110, and the semiconductor die 120 may be observable from the first side (e.g., top) of the die bonding attachment 110. The vacuum port 180 may be included in the compliant head unit 170, and the vacuum port 180 may help temporarily couple the semiconductor die 120 with die attach surface 175 (shown in FIG. 1).

The size and shape of the compliant head unit 170 may substantially correspond with the size and shape of the semiconductor die 120, but the present subject matter is not so limited. For example, FIG. 2 shows a periphery of the semiconductor die 120 in dashed lines and solid lines. The dashed lines indicate where the compliant head unit 170 interfaces with the semiconductor die 120, and the solid lines indicate where the periphery of the semiconductor die 120 is observable (e.g., from the first side of the die bonding attachment 110). Stated another way, the dashed lines shown in FIG. 2 signify where the compliant head unit 170 overlaps the semiconductor die 120, and the semiconductor die 120 is observable through the notch 200 and the vacuum port 180.

The compliant head unit 170 may define one or more recesses (e.g., cut-outs, notches, ports, or the like) in the compliant head unit 170. The one or more recesses may be aligned with the first window 140, shown in FIG. 1, and/or the second window 150). The one or more recesses may be adapted to expose a fiducial mark 210 included in the semiconductor die 120. For instance, the one or more recesses may help in the observation of the fiducial mark 210. The one or more recesses may improve the precision and accuracy of determining a positional relationship between the die placement and coupling apparatus 100 and the semiconductor die 120.

In an example, the one or more recesses help in locating the semiconductor die 120 within, for instance, a JEDEC tray, because the fiducial mark 210 is visible while the die placement and coupling apparatus 100 is positioned proximate the semiconductor die 120. Additionally, the one or more recesses help in aligning the die placement and coupling apparatus 100 with respect to the semiconductor die 120.

The one or more recesses may be defined to have varying sizes, shapes, quantity, and positions in the compliant head unit 170. As shown in FIG. 2, the compliant head unit 170 may define a notch 200. The notch 200 may be square in shape, but the present subject matter is not so limited. The notch 200 may be positioned at varying positions in the compliant head unit. For instance, the notch 200 may be positioned at a first side (e.g., a first corner) of the compliant head unit 170. Additionally, the notch 200 may be positioned at a second side (e.g., a second corner) of the compliant head unit 170. In an example, the first side of the compliant head unit 170 is opposite the second side of the compliant head unit 170. In another example, the one or more recesses includes at least four recesses (e.g., including the notch 200 at each corner of the compliant head unit 170).

Further, the vacuum port 180 may be include in the one or more recesses defined in the compliant head unit 170. The vacuum port 180 may extend through a thickness of the compliant head unit 170, and the vacuum port 180 may allow for the observation of the semiconductor die 120 through the compliant head unit 170. The position of the vacuum port 180 may coincide (e.g., correspond with) the fiducial mark 210 (or other fiducial marks included in the semiconductor die 120), and the fiducial mark 210 may be observable (e.g., visible through the second window 150) through the compliant head unit 170.

Figure 3:
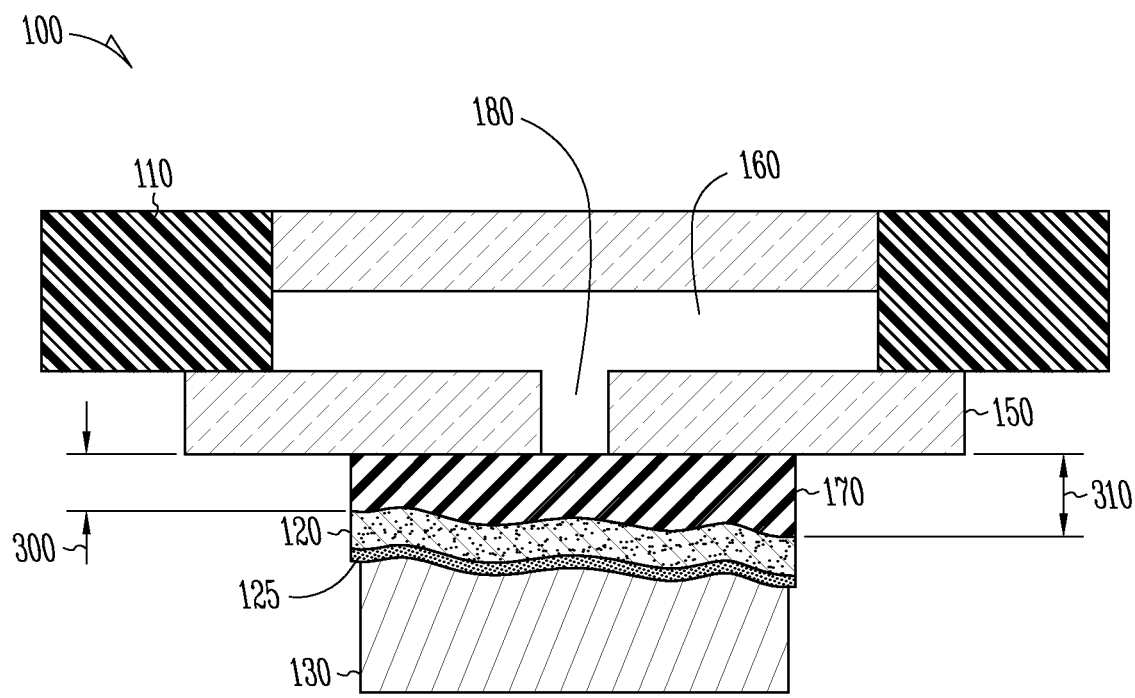
FIG. 3 illustrates a schematic, cross-sectional view of one example of a die placement and coupling apparatus, in accordance with an example of the present subject matter.

FIG. 3 illustrates a schematic, cross-sectional view of one example of a die placement and coupling apparatus, in accordance with an example of the present subject matter. As described herein, the die placement and coupling apparatus 100 may include the die bonding attachment 110, and may include the compliant head unit 170. The compliant head unit 170 may help couple a semiconductor die 120 to the substrate 130, including (but not limited to) helping couple the semiconductor die 120 to a non-uniform surface of the substrate 130.

The compliant material (e.g., the compliant material 172, shown in FIG. 1) included in the compliant head unit 170 includes a range of compliance. The range of compliance for the compliant head unit 170 allows for the compliant head unit 170 to yield in response to an applied force. For instance, the die attach surface 175 (shown in FIG. 1) may yield (e.g., be displaced) between a first distance 300 and a second distance 310. The range of compliance may include the first distance 300 and may include the second distance 310. The range of compliance helps facilitate the conformance of the die attach surface 175 (shown in FIG. 1) to a non-uniform surface of the substrate 130.

In an example, the compliant head unit 170 helps couple the semiconductor die 120 to the substrate, and the range of compliance helps couple the semiconductor die 120 to a non-uniform surface of the substrate 130 (e.g., as shown in FIGS. 1 and 3, with a surface of the substrate 130 undulating). The compliant material included in the compliant head unit 170 may help distribute the force applied to the die bonding attachment 110, and the range of conformance may allow for the die attach surface 175 (shown in FIG. 1) of the compliant head unit to conform to (e.g., correspond to, mimic, replicate, or the like) the non-uniform surface of the substrate 130.

In some examples, the range of compliance for the compliant material varies with the temperature of the compliant material (e.g., a thermoplastic, polyurethane foam, or the like). For example, the Young's modulus of the compliant material varies with the temperature of the compliant material, and the temperature of the compliant material may be controlled to adjust the range of compliance for the compliant material.

The compliant head unit 170 may help increase the surface area of the die bonding film 125 that is coupled to the substrate 130 by localizing the application of forces to the semiconductor die 120 (and/or the die bonding film 125). The increase in coupled surface area of the semiconductor die 120 (and/or the die bonding film 125) may improve the coupling (e.g., mechanical bond) between the semiconductor die 120 and the substrate 130. Improving the coupling between the semiconductor die 120 and the substrate 130 may help reduce the occurrence of voids between the semiconductor die 120 and the substrate 130, and may help reduce the separation (e.g., delamination, or the like) of the semiconductor die 120 from the substrate 130. Accordingly, improving the coupling between the semiconductor die 120 and the substrate 130 may help improve the reliability and performance of an electronic device, because the compliant head unit 170 helps reduce the separation of the semiconductor die 120 from the substrate 130.

As discussed herein, the die placement and coupling apparatus 100 may include the vacuum port 180, and in some examples, the vacuum port 180 is included in the compliant head unit 170, however the present subject matter is not so limited. In an example, the vacuum port 180 is included in the second window 150, and an opening of the vacuum port 180 is covered by (e.g., interfaces with) the compliant head unit 170. The compliant head unit 170 may include a porous material. For example, the porous material may include an open cell foam, a porous plastic (e.g., sintered porous plastic), or the like. The die attach surface 175 (shown in FIG. 1) of the compliant head unit 170 may be in fluidic communication with the vacuum port 180 through the porous material. A vacuum applied to the vacuum port 180 may help the die placement and coupling apparatus 100 to optionally couple an electronic component (e.g., the semiconductor die 120) with the compliant head unit 170.

Additionally, the compliant head unit 170 may include a wall that surrounds the porous material, and the walls may improve the optional coupling of the die placement and coupling apparatus 100 (for instance by limiting or altering the flow of air into the compliant head unit 170.

Figure 4:
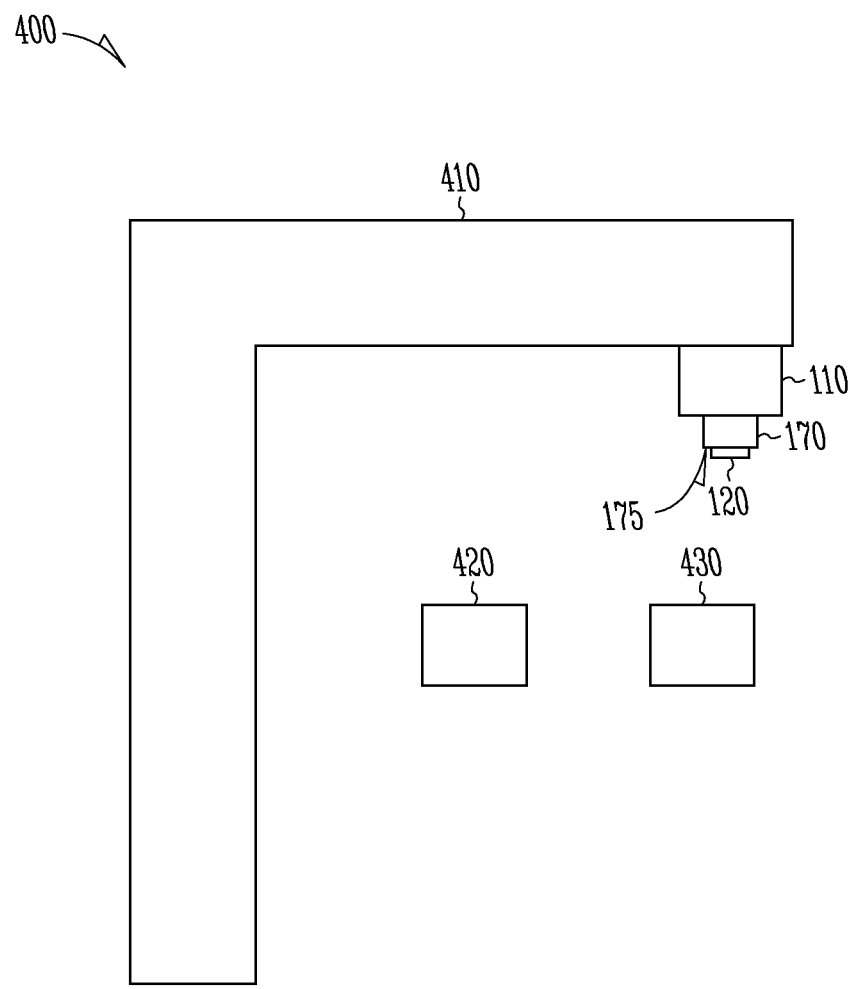
FIG. 4 illustrates a schematic view of one example of a die placement and coupling system.

FIG. 4 illustrates a schematic view of one example of a die placement and coupling system 400. The system 400 may include a pick and place apparatus 410. The pick and place apparatus 410 may include a robotic arm, and the robotic arm may include one or more degrees of freedom. The pick and place apparatus 410 may be repositioned in a variety of orientations, and may be utilized in manufacturing operations, including (but not limited to) manufacturing operations including the semiconductor die 120.

The die placement and coupling system 400 may be adapted to translate (e.g., move, change position, or the like) the semiconductor die 120, including (but not limited to) translating the semiconductor die 120 from a first position 420 to a second position 430. The first position 420 may be coincident with a portion of a JEDEC tray. The second position 430 may be coincident with a portion of the substrate 130, including (but not limited to) a non-uniform surface of the substrate 130, or within a cavity defined by the substrate 130.

The pick and place apparatus 410 may include the die bonding attachment 110, and the compliant head unit 170 may be coupled to the die bonding attachment 110. The die placement and coupling system 400 may be adapted to allow for the observation of electronic components (e.g., the semiconductor die 120) that are temporarily held at the die attach surface 175.

Figure 5:
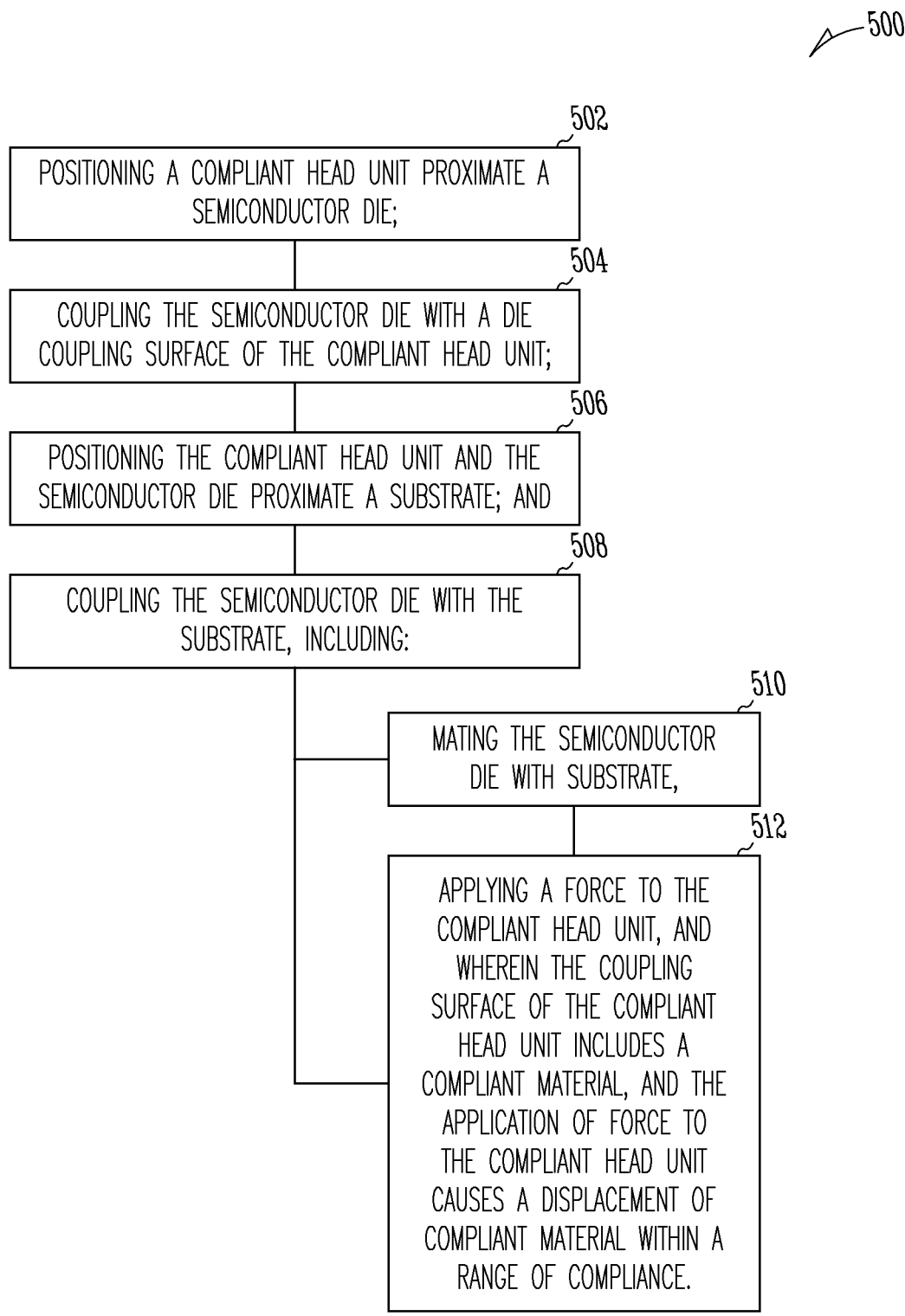
FIG. 5 illustrates one example of a method for positioning and coupling a die to an electronic device.

FIG. 5 illustrates one example of a method 500 for positioning and coupling a die to an electronic device. In describing the method 500, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described in the method 500 include, but are not limited to, the corresponding numbered elements provided herein and other corresponding elements described herein (both numbered and unnumbered) as well as their equivalents.

At 502, the method 500 may include positioning a compliant head unit 470 proximate a semiconductor die 120. The method 500 may include coupling a die bonding film 125 to the semiconductor die 120. At 504, the method 500 may include coupling (e.g., temporarily holding) the semiconductor die 120 with a die attach surface 175 of the compliant head unit 170. Coupling the semiconductor die 120 with the die attach surface 175 of the compliant head unit 170 may include applying a vacuum between the semiconductor die 120 and the die attach surface 175.

At 506, the method 500 may include positioning the compliant head unit and the semiconductor die 120 proximate a substrate 130. In some examples, the method 500 includes positioning the die bonding film 125 between the semiconductor die 120 and the substrate 130. The method 500 may include positioning the semiconductor die within a cavity defined by the substrate. In some examples, the method 500 includes referencing a fiducial mark 210 included in the substrate 130 to determine a position of the semiconductor die 120 with respect to the cavity defined by the substrate 130. Further, the method 500 may include positioning a fiducial mark 210 within a recess defined by the compliant head unit 170, wherein the fiducial mark is included in the semiconductor die 120.

At 508, the method 500 may include coupling the semiconductor die with the substrate. Coupling the semiconductor die 120 with the substrate 130 may include at 510 that the semiconductor die 120 is mated with the substrate 130. Coupling the semiconductor die 120 with the substrate 130 may include at 512 that a force is applied to the compliant head unit 170. The die attach surface 175 of the compliant head unit includes a compliant material, and the application of force to the compliant head unit may cause a displacement of compliant material, for instance within a range of compliance. The method 500 may include decoupling the semiconductor die from the compliant head unit.

VARIOUS NOTES & EXAMPLES

Aspect 1 can include or use subject matter (such as an apparatus, a system, a device, a method, a means for performing acts, or a device readable medium including instructions that, when performed by the device, can cause the device to perform acts, or an article of manufacture), such as can include or use a die placement and coupling apparatus. The die placement and coupling apparatus may include a die bonding attachment.

The die placement and coupling apparatus may include a compliant head unit. The compliant head unit may be adapted to adapted to optionally couple with a semiconductor die. The compliant head unit may include a die attach surface. The die attach surface may include a compliant material, and the compliant material may be coupled to, or included in, the compliant head unit. The layer of compliant material may be adapted to yield in response to an applied force. The die attach surface may be adapted to mate with the semiconductor die when the semiconductor die is coupled with the compliant head unit.

The die placement and coupling apparatus may include a vacuum port. The vacuum port may be in communication with the die attach surface. The vacuum port may be adapted to have a vacuum applied to the vacuum port, and the vacuum temporarily holds the semiconductor die to the die attach surface.

Aspect 2 can include or use, or can optionally be combined with the subject matter of Aspect 1, to optionally include or use that the compliant head unit may define one or more recesses. The one or more recesses may be adapted to expose one or more fiducial marks included in the semiconductor die.

Aspect 3 can include or use, or can optionally be combined with the subject matter of Aspect 2 to optionally include or use that the one or more recesses may include a first recess and may include a second recess. The first recess and the second recess may be positioned on opposite sides of the compliant head unit.

Aspect 4 can include or use, or can optionally be combined with the subject matter of one or any combination of Aspects 1 through 3 to optionally include or use that the compliant head unit may define one or more fiducial observation ports. The compliant material may define a void in the compliant material. The void in the compliant material may coincide with at least one of the one or more fiducial marks.

Aspect 5 can include or use, or can optionally be combined with the subject matter of one or any combination of Aspects 1 through 4 to optionally include or use that the layer of compliant material may includes ePTFE, PTFE, silicone rubber, or polyurethane rubber, or the like.

Aspect 6 can include or use, or can optionally be combined with the subject matter of one or any combination of Aspects 1 through 5 to optionally include or use that the layer of compliant material may include an open cell foam. The open cell foam may cover a first opening of the vacuum port.

Aspect 7 can include or use, or can optionally be combined with the subject matter of one or any combination of Aspects 1 through 6 to optionally include or use that the die bonding attachment may include a transparent material.

Aspect 8 can include or use, or can optionally be combined with the subject matter of Aspect 7 to optionally include or use that the compliant head unit may defines one or more recesses. The transparent material of the die bonding attachment may be aligned with the one or more recesses of the compliant head unit.

Aspect 9 can include or use subject matter (such as an apparatus, a system, a device, a method, a means for performing acts, or a device readable medium including instructions that, when performed by the device, can cause the device to perform acts, or an article of manufacture), such as can include or use a die placement and coupling system. The die placement and coupling system may include a pick and place apparatus. The pick and place apparatus may include a robotic arm, and the robotic arm may include one or more degrees of freedom. The die placement and coupling system may include a die bonding attachment. The die bonding attachment may be coupled to the pick and place apparatus.

The die placement and coupling system may include a compliant head unit. The compliant head unit may be adapted to optionally couple with a semiconductor die. The compliant head unit may include a die attach surface. The die attach surface may include a layer of compliant material. The layer of compliant material may be coupled to, or included in, the compliant head unit. The layer of compliant material may be adapted to mate with the semiconductor die when the semiconductor die is coupled with the compliant head unit. The compliant material may be adapted to yield in response to an applied force.

The die placement and coupling system may include a vacuum port. The vacuum port may be in communication with the die attach surface. The vacuum port may be adapted to have a vacuum applied to the vacuum port. The vacuum may temporarily couple the semiconductor die to the die attach surface.

Aspect 10 can include or use, or can optionally be combined with the subject matter of Aspect 9, to optionally include or use that the pick and place apparatus may be adapted to translate the semiconductor die from a first position to a second position (or additional positions).

Aspect 11 can include or use, or can optionally be combined with the subject matter of Aspect 10 to optionally include or use that the first position or the second position may correspond to a surface of a substrate of an electronic device.

Aspect 12 can include or use, or can optionally be combined with the subject matter of one or any combination of Aspects 9 or 10 to optionally include or use that the first position or the second position may correspond to a cavity defined by a substrate of an electronic device.

Aspect 13 can include or use, or can optionally be combined with the subject matter of one or any combination of Aspects 9 through 12 to optionally include or use that the compliant material may include a range of compliance. The range of compliance may allow the die attach surface to conform to the surface of the substrate.

Aspect 14 can include or use, or can optionally be combined with the subject matter of one or any combination of Aspects 9 through 13 to optionally include or use that the die bonding attachment may include one or more transparent members.

Aspect 15 can include or use subject matter (such as an apparatus, a system, a device, a method, a means for performing acts, or a device readable medium including instructions that, when performed by the device, can cause the device to perform acts, or an article of manufacture), such as can include or use a method for positioning and coupling a die to an electronic device. The method may include positioning a compliant head unit proximate a semiconductor die. The method may include coupling the semiconductor die with a die attach surface. The die attach surface may be included in the compliant head unit. The method may include positioning the compliant head unit and the semiconductor die proximate a substrate. The method may include coupling the semiconductor die with the substrate. Coupling the semiconductor die with the substrate may include mating the semiconductor die with the substrate. Coupling the semiconductor die with the substrate may include applying a force to the compliant head unit. Coupling the semiconductor die with the substrate may include that the die attach surface of the compliant head unit include a compliant material. An application of force to the compliant head unit may cause a displacement of compliant material within a range of compliance.

Aspect 16 can include or use, or can optionally be combined with the subject matter of Aspect 15, to optionally include or use that the method may include positioning the semiconductor die within a cavity that may be defined by the substrate.

Aspect 17 can include or use, or can optionally be combined with the subject matter of Aspect 16 to optionally include or use that the method may include referencing a fiducial mark included in the substrate. The fiducial mark may be referenced to determine a position of the semiconductor die with respect to the cavity defined by the substrate.

Aspect 18 can include or use, or can optionally be combined with the subject matter of one or any combination of Aspects 15 through 17 to optionally include or use that the method may include positioning a fiducial mark within a recess defined by the compliant head unit. The fiducial mark may be included in the semiconductor die.

Aspect 19 can include or use, or can optionally be combined with the subject matter of one or any combination of Aspects 15 through 18 to optionally include or use that the method may include decoupling the semiconductor die from the compliant head unit.

Aspect 20 can include or use, or can optionally be combined with the subject matter of one or any combination of Aspects 15 through 19 to optionally include or use that the method may include positioning a die bonding film between the semiconductor die and the substrate.

Aspect 21 can include or use, or can optionally be combined with the subject matter of one or any combination of Aspects 15 through 20 to optionally include or use that coupling the semiconductor die with the die attach surface of the compliant head unit may include applying a vacuum between the semiconductor die and the die attach surface.

Aspect 22 can include or use, or can optionally be combined with any portion or combination of any portions of any one or more of Aspects 1 through 21 to include or use, subject matter that can include means for performing any one or more of the functions of Aspects 1 through 21, or a machine-readable medium including instructions that, when performed by a machine, cause the machine to perform any one or more of the functions of Aspects 1 through 21.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A die placement and coupling apparatus, comprising:
   a die bonding attachment;
   a compliant head unit adapted to optionally couple with a semiconductor die, the compliant head unit including:
      a layer of compliant material;
      a die attach surface adapted to mate with the semiconductor die when the semiconductor die is coupled with the compliant head unit;
      one or more recesses adapted to expose one or more fiducial marks included in the semiconductor die; and
      wherein the layer of compliant material is adapted to yield in response to an applied force; and
   a vacuum port in communication with the die attach surface of the compliant head unit, wherein the vacuum port is adapted to have a vacuum applied to the vacuum port, and the vacuum temporarily holds the semiconductor die to the die attach surface.

2. The die placement and coupling apparatus of claim 1, further comprising one or more windows including a transparent material.

3. The die placement and coupling apparatus of claim 2, wherein:
   the one or more windows are located on a first side of the die bonding attachment, and
   the compliant head unit is located on a second side of the die bonding attachment.

4. The die placement and coupling apparatus of claim 2, wherein:
   at least one of the one or more windows is aligned with the one or more recesses.

5. The die placement and coupling apparatus of claim 1, wherein the layer of compliant material includes ePTFE, PTFE, silicone rubber, or polyurethane rubber.

6. The die placement and coupling apparatus of claim 1, wherein the layer of compliant material includes an open cell foam, and the open cell foam covers a first opening of the vacuum port.

7. The die placement and coupling apparatus of claim 1, wherein:
   the one or more recesses includes a first recess and a second recess,
   the first recess and the second recess are positioned on opposite sides of the compliant head unit.

8. The die placement and coupling apparatus of claim 7, wherein the transparent material of the die bonding attachment is aligned with the one or more recesses of the compliant head unit.

9. A die placement and coupling system, comprising:
   a pick and place apparatus, including a robotic arm that includes one or more degrees of freedom;
   a die bonding attachment coupled to the pick and place apparatus;
   a compliant head unit adapted to optionally couple with a semiconductor die, the compliant head unit including:
   a layer of compliant material;
   a die attach surface including the layer of compliant material coupled to the compliant head unit, wherein the layer of compliant material is adapted to mate with the semiconductor die when the semiconductor die is coupled with the compliant head unit;
   one or more recesses adapted to expose one or more fiducial marks included in the semiconductor die;
   and wherein the layer of compliant material is adapted to yield in response to an applied force; and
   a vacuum port in communication with the die attach surface of the compliant head unit, wherein the vacuum port is adapted to have a vacuum applied to the vacuum port, and the vacuum temporarily couples the semiconductor die to the die attach surface.

10. The die placement and coupling system of claim 9, wherein the pick and place apparatus is adapted to translate the semiconductor die from a first position to a second position.

11. The die placement and coupling system of claim 10, wherein the first position or the second position corresponds to a surface of a substrate of an electronic device.

12. The die placement and coupling system of claim 10, wherein the first position or the second position corresponds to a cavity defined by a substrate of an electronic device.

13. The die placement and coupling system of claim 9, wherein the layer of compliant material has a range of compliance, whereby the range of compliance allows the die attach surface to conform to the surface of a substrate.

14. The die placement and coupling system of claim 9, wherein the die bonding attachment includes one or more transparent members.

15. A method for positioning and coupling a die to an electronic device, comprising:
- positioning a compliant head unit proximate a semiconductor die, wherein the compliant head unit includes:
- a layer of compliant material;
- a die attach surface adapted to mate with the semiconductor die when the semiconductor die is coupled with the compliant head unit;
- one or more recesses adapted to expose one or more fiducial marks included in the semiconductor die;
- wherein the layer of compliant material is adapted to yield in response to an applied force;
- coupling the semiconductor die with the die attach surface of the compliant head unit;
- positioning the compliant head unit and the semiconductor die proximate a substrate; and
- coupling the semiconductor die with the substrate, including:
  - mating the semiconductor die with the substrate,
  - applying a force to the compliant head unit, and
  - wherein the application of force to the compliant head unit causes a displacement of the layer of compliant material within a range of compliance.

16. The method of claim 15, further comprising positioning the semiconductor die within a cavity defined by the substrate.

17. The method of claim 16, further comprising referencing a fiducial mark of the one or more fiducial marks included in the substrate to determine a position of the semiconductor die with respect to the cavity defined by the substrate.

18. The method of claim 15, further comprising positioning a fiducial mark of the one or more fiducial marks within a recess defined by the compliant head unit, wherein the fiducial mark is included in the semiconductor die.

19. The method of claim 15, further comprising decoupling the semiconductor die from the compliant head unit.

20. The method of claim 15, further comprising positioning a die bonding film between the semiconductor die and the substrate.

21. The method of claim 15, wherein coupling the semiconductor die with the die attach surface of the compliant head unit includes applying a vacuum between the semiconductor die and the die attach surface.

* * * * *